United States Patent [19]

Sato et al.

[11] Patent Number: 5,087,828

[45] Date of Patent: Feb. 11, 1992

[54] TIMING CIRCUIT FOR SINGLE LINE SERIAL DATA

[75] Inventors: Hideki Sato; Toshihide Masamura, both of Tokyo, Japan

[73] Assignee: Daiichi Denshi Kogyo Kabushiki Kaisha, Japan

[21] Appl. No.: 642,762

[22] Filed: Feb. 12, 1991

[30] Foreign Application Priority Data

Feb. 14, 1990 [JP] Japan ................... 2-33507

[51] Int. Cl.$^5$ ................... H03K 19/92; H03K 17/16
[52] U.S. Cl. ................... 307/269; 307/443; 307/571; 307/262; 328/63; 328/72
[58] Field of Search ............ 307/443, 269, 571, 262; 328/63, 72, 74

[56] References Cited

U.S. PATENT DOCUMENTS 4,737,722  4/1988  Ramesh et al. ............... 328/72
4,989,223  1/1991  Katayose et al. ............. 328/63

FOREIGN PATENT DOCUMENTS 0082812  3/1990  Japan ............... 307/269

Primary Examiner—Stanley D. Miller
Assistant Examiner—Margaret Rose Wambach
Attorney, Agent, or Firm—Silverman, Cass & Singer, Ltd.

[57] ABSTRACT

A timing adjusting circuit for single line serial data includes a synchronous data sampling circuit for sampling data input from the exterior synchronously with a reference clock pulse, a data edge detection circuit for outputting data edge detection signals, and a synchronous pulse generation circuit for generating repetitive pulses synchronized with output from the data edge detection circuit. The timing circuit further includes an inversion circuit for inverting branched part of the reference clock pulse, a sub-data sampling circuit for sampling the branched data at the inverted reference clock pulse, a sub-data edge detection circuit for outputting edge detection signals synchronized with the inverted reference clock pulse, a sub-synchronous pulse generation circuit for generating repetitive pulses synchronized with output from the data edge detection circuit, an adder for performing logical addition of output of the synchronous and sub-synchronous pulse generation circuits, an adder for performing logical OR of output of the data sampling and edge detection circuits, a waveform shaping circuit for eliminating extraneous signals, and an output timing circuit for adjusting timing of output data and synchronous clock pulse output from the waveform shaping circuit.

1 Claim, 5 Drawing Sheets

FIG_1
PRIOR ART

FIG_3 PRIOR ART

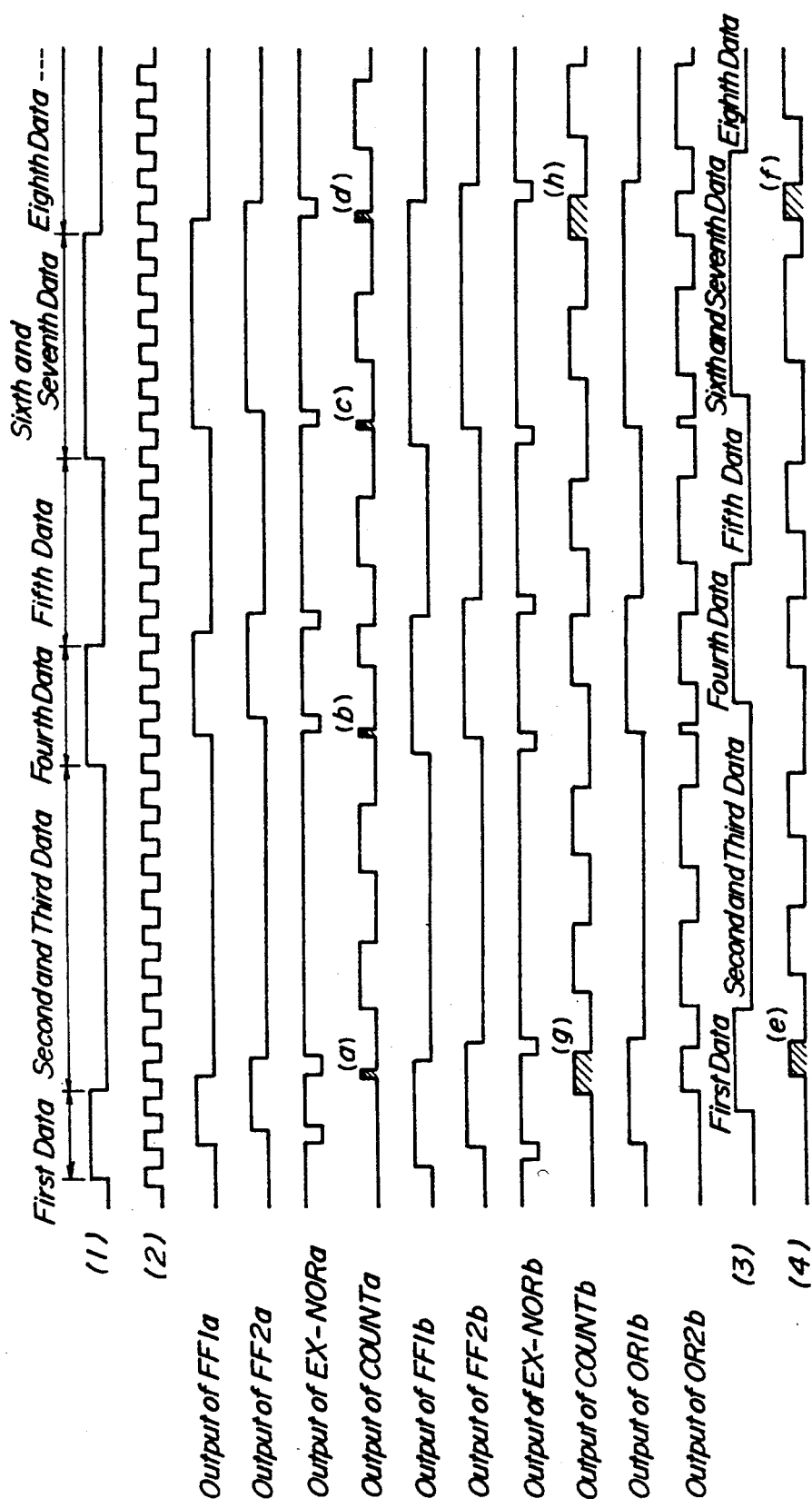
FIG._5

TIMING CIRCUIT FOR SINGLE LINE SERIAL DATA

BACKGROUND OF THE INVENTION

This invention relates to a timing circuit for synchronizing a digital data processor and input data at the single line serial interface of the digital data processor.

There have been timing circuits for single line serial data used at input interfaces of digital data processors. FIG. 1 illustrates one of such circuits by way of example.

Referring to FIG. 1, a data sampling circuit A is composed of a delay flip-flop FF1a of a positive logic for sampling input data input from an input data terminal 1 with reference clock pulses input from a reference clock input terminal 2.

A data edge detection circuit B is composed of a delay flip-flop FF2a of a negative logic and an exclusive negative OR gate EX-NORa to generate data edge detection signals synchronously with the reference clock pulses.

A synchronous pulse generation circuit C is composed of an up counter COUNTa and it receives the data edge detection signals from the data edge detection circuit B as reset input and generates repetitive pulses of equal period. In many cases, the period of the repetitive pulses is set so as to be coincident with a width of the minimum unit pulse.

A waveform shaping circuit D is composed of a delay flip-flop FF4a of a positive logic for eliminating hazardous or extraneous signals, so-called "glitch noise".

An output timing circuit E is composed of a delay flip-flop circuit FF3a of a positive logic for adjusting timing of output data and synchronous output clock pulses from the waveform shaping circuit D.

In this case, FF2a is the delay flip-flop circuit operated by the negative logic and FF1a, FF3a and FF4a are the delay flip-flop circuits operated by the positive logic. EX-NORa is the exclusive negative OR gate. COUNTa is the counter whose output changes at count "2".

With the timing circuit of the prior art shown in FIG. 1, the input data fed from the input data terminal 1 is sampled in the data sampling circuit A and then transmitted through the data edge detection circuit B and the output timing circuit E and further through the output data terminal 3 to a digital data processor.

Moreover, the reference clock pulses input from the reference clock input terminal 2 are criteria for operations of this timing circuit and supplied to the means FF1a, FF2a, COUNTa, FF3a and FF4a. In the flip-flop FF1a, the supplied clock pulses are used as sampling clock pulses.

The repetition pulses produced in the synchronizing pulse generation circuit C are transmitted through the wave shaping circuit D and further through the synchronous clock output terminal 4 to the digital data processor.

In the timing circuit of the prior art shown in FIG. 1, assuming that L is the minimum unit pulse width of the input data from the input data terminal 1, the input data is constituted by pulses having a width of nL (n is a natural number). Moreover, when the reference clock pulse is synchronized at the pulse width of L/4, if the input waveform input from the input data terminal 1 is distorted more than $\pm \frac{1}{4}$ L due to parasitic electrostatic capacity of signal lines and the like, the normal or proper output cannot be obtained from the synchronous clock output terminal 4. Therefore, there is a problem in this circuit of the prior art in that an allowable tolerance for distortion of pulse widths of the input data is insufficient.

FIG. 2 illustrates a timing chart showing the normal operation of the circuit shown in FIG. 1, while FIG. 3 illustrates, by way of example, the problem of the circuit shown in FIG. 1.

In FIG. 2, the unit data length is L(s), and the period of the reference clock pulse is L/4(s). The period of the synchronous clock pulse is L(s) and one clock pulse corresponds to one datum.

In FIG. 3, the length of the first datum is 5/8 L(s) which is 3/8 L(s) shorter than the pulse width L(s) of the first datum without distortion. On the other hand, the length of the fifth datum is 11/8 L(s) which is 3/8 L(s) longer than that of the fifth datum without distortion. The lengths of the second and third data are 19/8 L(s) which are 3/8 L(s) longer than the pulse width 2 L(s) of the second and third data without distortion. On the other hand, the lengths of the sixth and seventh data are 13/8 L(s) which are 3/8 L(s) shorter than those of the sixth and seventh data without distortion. The period of the reference clock pulse is $\frac{1}{4}$ L(s) which is equal to that in FIG. 2.

Signals at (a), (b), (c) and (d) are produced by the rising of output signals caused by counting operation of the counter COUNTa and trailing of output signals caused at the same time by reset signals input by the gate EX-NORa. Therefore, these signals are unstable because they occur only when the rising and trailing of said two output signals is coincident with each other in timing. Such hazardous or extraneous signals must be eliminated because they may cause malfunction of the circuit in the next stage. For example, the signal (b) is eliminated, because data sampling is effected in the flip-flop FF3a of the next stage during the time from T to T'. The same is applied to the signals (a), (c) and (d).

As a result of elimination of the signals (a) and (d), the signals to be inherently output at the positions (e) and (f) could not be obtained so that synchronous clock pulses corresponding to the first and seventh data do not occur. Accordingly, the object of this timing adjusting circuit of the prior art could not be accomplished.

SUMMARY OF THE INVENTION

It is an object of the invention to provide a timing circuit which is able to widen the allowable tolerance for pulse width distortion of input data without increasing the frequency of reference clock pulses or to lower the frequency of clock pulses operating the circuit without narrowing the allowable tolerance for pulse width distortion of input data.

This object can be accomplished by logically adding of output data and synchronous clock pulses obtained by operating the circuits shown in FIG. 1 with positive logic clock pulses and negative logic clock pulses, respectively.

According to the invention, data is branched to obtain two parts which are processed by positive and negative logic circuits, respectively, and the processed data is then added to each other. As a result of this, the allowable tolerance for pulse width distortion of input data can be widened without changing reference clock pulses, or reference clock frequency can be lowered to half of those of the prior art without changing the allowable tolerance for pulse width distortion of input data. Therefore, the above object can be achieved by the present invention.

As can be seen from the comparison of FIG. 5 illustrating the operation of the circuit according to the invention with FIG. 3, synchronous clock pulses at (e) and (f) can be obtained according to the invention, which otherwise could not be obtained.

The invention will be more fully understood by referring to the following detailed specification and claims taken in connection with the appended drawings.

BRIEF DESCRIPTION OF THE DRAWINGS

FIG. 5 is a timing chart of the timing circuit according to the invention.

EXPLANATION OF THE PREFERRED EMBODIMENT

Figure 4:
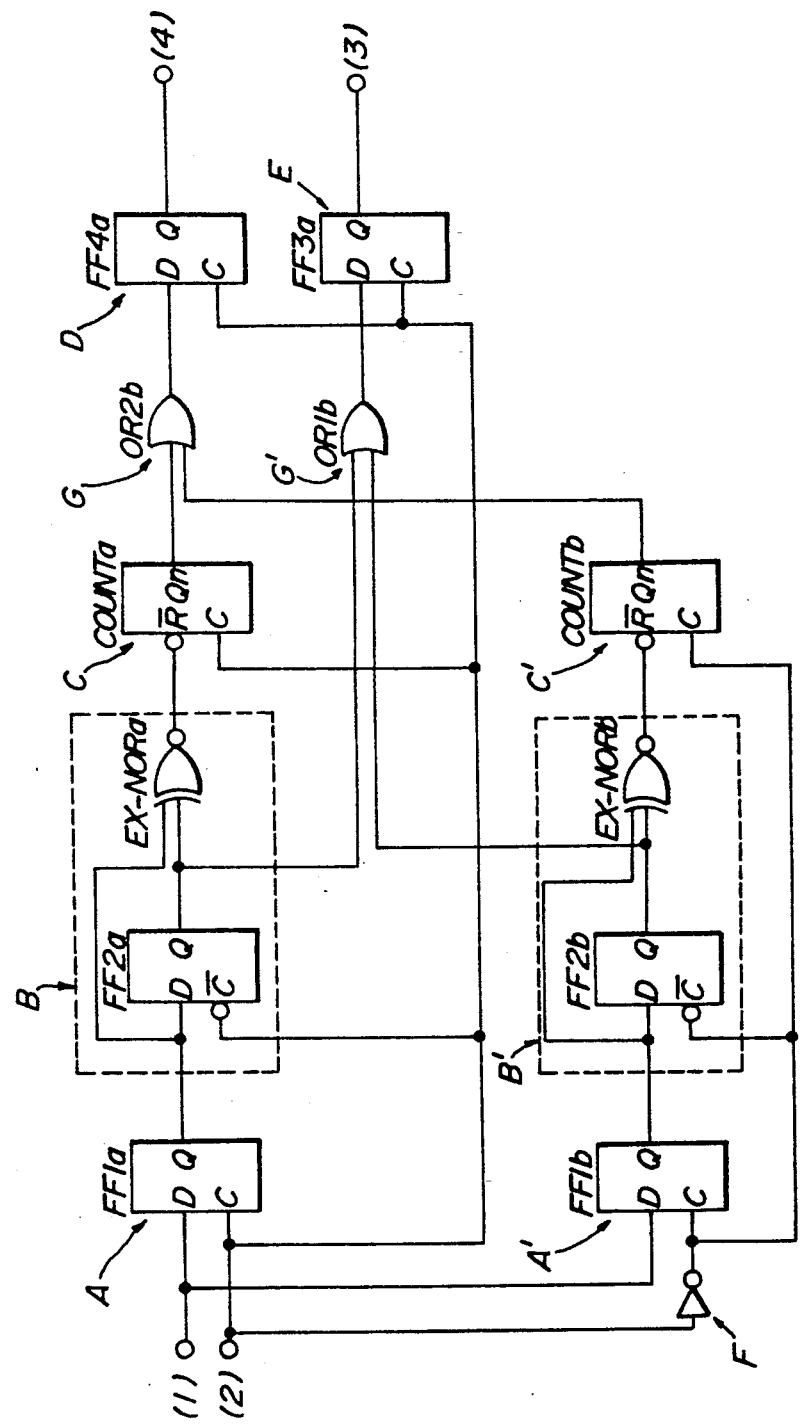
FIG. 4 illustrates a timing circuit according to the invention.

FIG. 4 illustrates the synchronized circuit for single line serial data. As shown in FIG. 4, a data sampling circuit A is composed of a delay flip-flop FF1a of a positive logic for sampling input data from an input terminal 1 with the aid of reference clock pulses input from a reference clock input terminal 2.

A data-edge detection circuit B is composed of a delay flip-flop circuit FF2a of a negative logic and an exclusive negative OR gate EX-NORa to generate data-edge detection signals synchronously with the reference clock pulses.

A synchronizing pulse generation circuit C is composed of a counter COUNTa being reset by data edge detection signals and generates repetition pulses synchronous with outputs of the delay flip-flop FF2a.

A waveform shaping circuit D is composed of a delay flip-flop FF4a of a positive logic for eliminating hazardous or extraneous signals (glitch noise).

An output timing circuit E is for adjusting timing of output data and synchronous clock pulses.

An inversion circuit F is the characterizing means of the present invention for actuating the following circuits A', B' and C' in negative logic. The inversion circuit F branches part of the reference clock pulses supplied from a digital data processor and inverts the branched part of the reference clock pulses.

A sub-data sampling circuit A' is for sampling input data with negative clock pulses.

A sub-data edge detection circuit B' is for detecting edges of output data from the sub-data sampling circuit A'.

A sub-synchronous pulse generation circuit C' is composed of a counter COUNTb and receives data edge detection signals from the sub-data edge detection circuit B as reset inputs and generates repetition pulses synchronizing with the outputs of the flip-flop FF2b of the sub-data edge detection circuit B'.

An adder G is composed of OR gate OR2b to perform the logical addition of outputs of the synchronous pulse generation circuit C and sub-synchronous pulse generation circuit C'.

A sub-adder G' is composed of an OR gate OR1b to perform the logical addition of the delay flip-flop FF2a and FF2b.

In this case, FF1a, FF3a, FF4a and FF1b are the delay flip-flops operated by the positive clock pulses. EX-NORa and EX-NORb are exclusive negative OR gates. COUNTa and COUNTb are the counters whose outputs change at count "2". OR1b and OR2b are the OR gates. FF2a and FF2b are the delay flip-flops operated by the negative clock pulses.

With the synchronized circuit for single line serial data according to the invention, data input into the data input terminal 1 is divided into two, one being transmitted into the data sampling circuit A and the other being transmitted into the sub-data sampling circuit A'.

The data transmitted into the data sampling circuit A is sampled therein and further divided into two, one being transmitted into the flip-flop FF2a of the data edge detection circuit B and the other being transmitted into the gate EX-NORa.

The data passed through the flip-flop FF2a is further divided into two, one being transmitted into the gate EX-NORa where the data is processed by the exclusive negative OR operation together with outputs from the flip-flop FF1a so as to become reset input the counter COUNTa. The other data is input into the sub-adder G' where the data is processed by the logical addition together with the output from the flip-flop FF2b later described. Thereafter, the output data is synchronized with synchronous clock output in the flip-flop FF3a and transmitted through the output data terminal 3 to the digital data processor.

Repetitive pulses generated in the counter COUNTa are input into the gate OR2b where the input pulses are processed by the logical addition together with output of the counter COUNTb. After waveforms of the processed pulses are shaped in the flip-flop FF4a, the shaped pulses are transmitted through the synchronous clock output terminal 4 into the digital data processor.

As above described, the data input into the input data terminal 1 is divided into two, one being transmitted into the flip-flop FF1a and the other being transmitted into the flip-flop FF1b. The data transmitted into the flip-flop FF1b where the data is sampled and divided into two, one being input into the flip-flop FF2b and the other being input into the gate EX-NORb. The data passed through the flip-flop FF2b is further divided into two, one being input into the gate EX-NORb where the data is processed by the exclusive negative OR operation together with output from the flip-flop FF1b so as to become reset input for the counter COUNTb, the other data being input into the sub-adder G. Repetitive pulses produced in the counter COUNTb are input into the gate OR2b.

Figure 1:
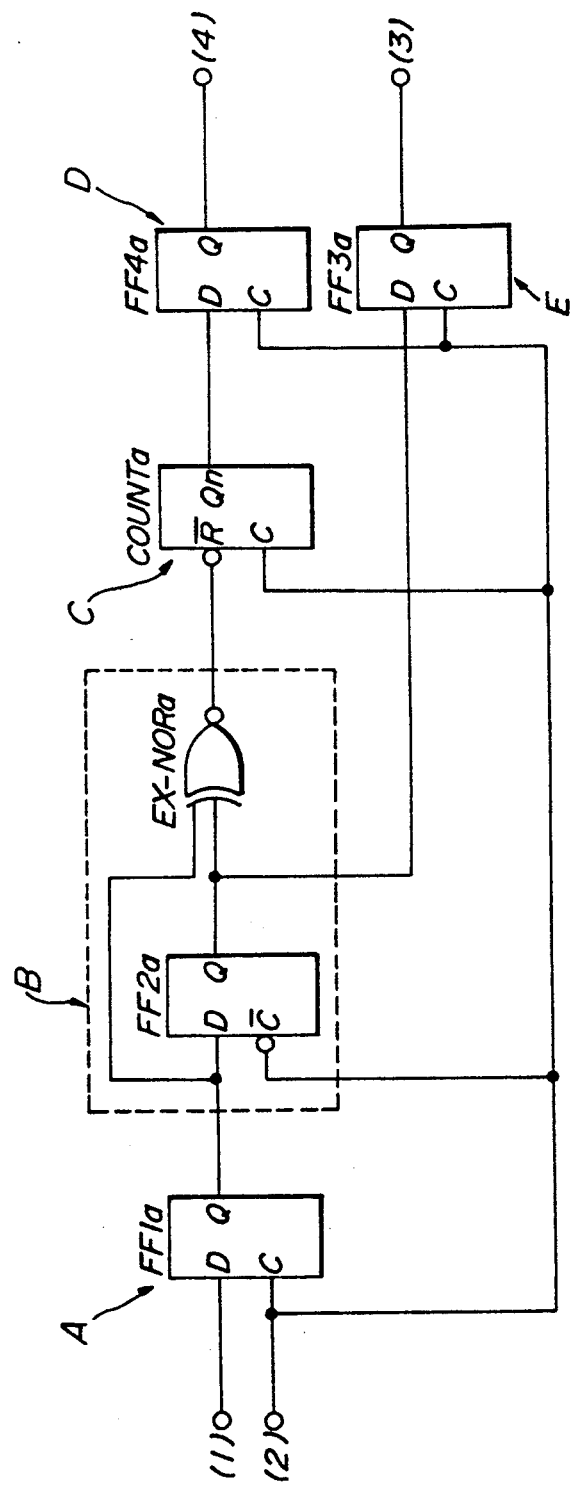
FIG. 1 illustrates a timing circuit of the prior art.
Figure 2:
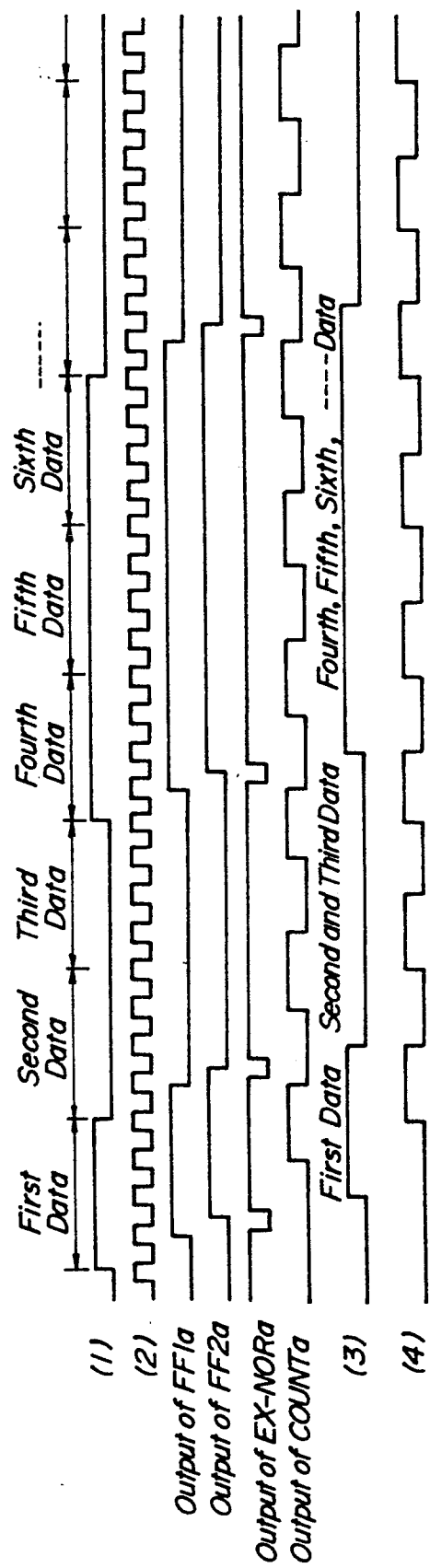
FIG. 2 is a timing chart of the circuit of the prior art at ordinary time.
Figure 3:
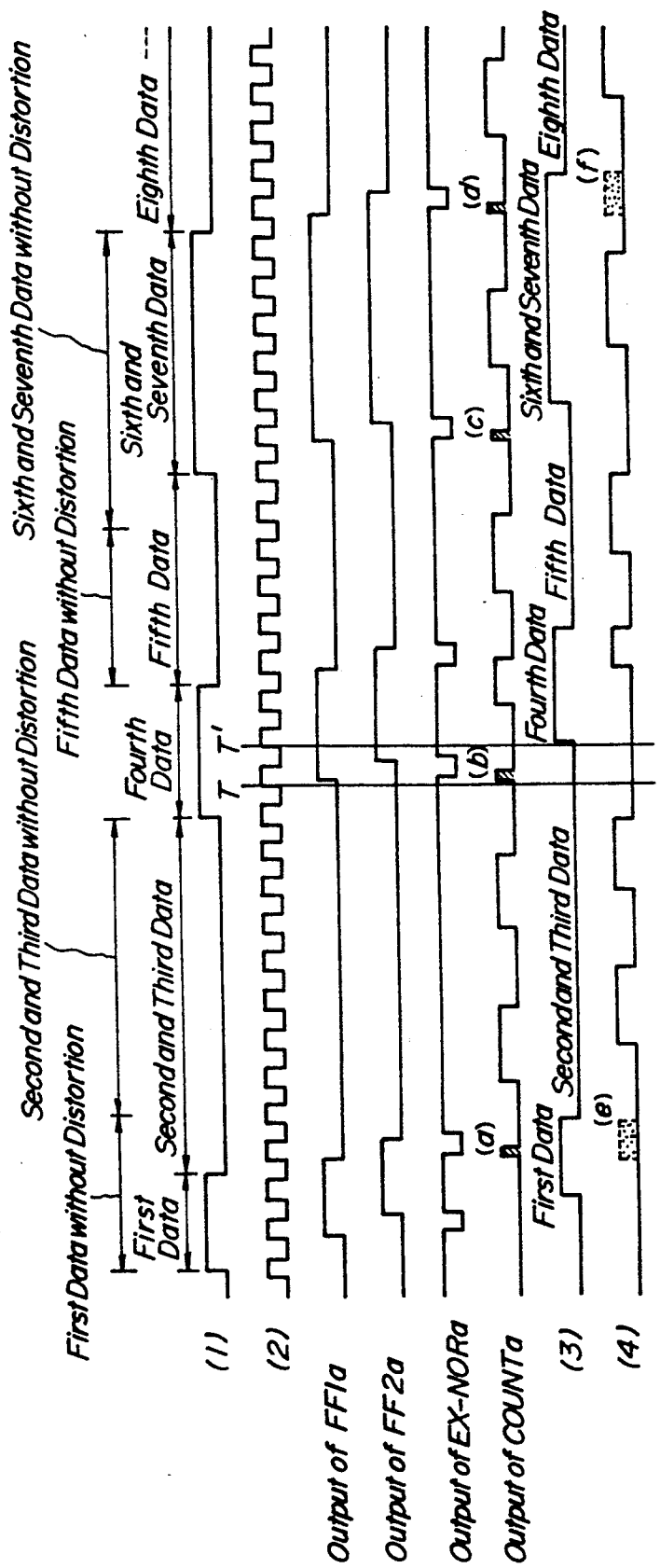
FIG. 3 is a timing chart of the circuit of the prior art at out of ordinary time.

The operations described above are shown in a timing chart in FIG. 5. In FIG. 5, a period of the reference clock is L/4(s) which is equal to that in FIG. 3. Moreover, waveforms of the input data are equal to those in FIG. 3. As the signal (a) and (d) are eliminated in the prior art as shown in FIG. 3, signals (e) and (f) could not be obtained as described above. However, as signals (g) and (h) are added to the signals at (a) and (f) by the logical addition according to the invention, signals (e) and (f) can be obtained.

The synchronized circuit for single line serial data having the constitution and the function described above according to the invention can bring about the following significant effects peculiar to the present invention.

(1) The allowable tolerance for pulse width distortion (Jitter) can be widened (1.5 times in this embodiment), although the clock pulses are substantially equal in frequency to those of the prior art.

(2) The frequency of the clock pulses can be made half those of the prior art, while keeping substantially the same allowable tolerance of the pulse width distortion (Jitter) as those of the prior art.

(3) Output data synchronized with the reference clock pulses and synchronous clock pulses synchronized with the output data can be obtained. Therefore, circuits of a digital data processor can be synchronous circuits without considering timing of the input data and the reference clock so that design of the circuit becomes easy. With this circuit according to the invention, moreover, delay time of circuit constituent elements is not utilized so that the operation of the circuit can be realized as a logic free from the delay time of the elements. Therefore, this circuit according to the invention is very advantageous, for example, when designing circuits using elements (gate array) which require computer simulations. Moreover, this circuit according to the invention is particularly effective for circuits susceptible to pulse width distortions of data such as series-parallel conversion circuits.

While the invention has been particularly shown and described with reference to preferred embodiments thereof, it will be understood by those skilled in the art that the foregoing and other changes in form and details can be made therein without departing from the spirit and scope of the invention.

What is claimed is:

1. A synchronized circuit for single line serial data comprising:
    a data sampling circuit (A) composed of a delay flip-flop (FF1a) operated by positive logic clock pulses for sampling data input from the exterior with reference clock pulses supplied from a digital data processor;
    a data edge detection circuit (B) composed of a delay flip-flop (FF2a) operated by negative logic clock pulses and an exclusive negative OR gate (EX-NORa) for detecting change in signal of output data from said data sampling circuit to output data edge detection signals synchronized with reference clock pulses;
    a synchronous pulse generation circuit (C) composed of a counter (COUNTa) operated by positive logic clock pulses and receiving said data edge detection signals as reset input signals for generating repeated pulses synchronized with outputs from the second mentioned delay flip-flop (FF2a);
    an inversion circuit (F) for branching part of reference clock pulses supplied from the digital data processor and inverting the branched part of the reference clock pulses;
    a sub-data sampling circuit (A') composed of a delay flip-flop (FF1b) operated by positive logic clock pulses for sampling the branched input data at the inverted reference clock pulses;
    a sub-data edge detection circuit (B') composed of a delay flip-flop (FF2b) operated by negative logic clock pulses and an exclusive negative OR gate (EX-NORb) for detecting the change in signal of output data from said sub-data sampling circuit to output edge detection signals synchronized with the inverted reference clock pulses;
    a sub-synchronous pulse generation circuit (C') composed of a counter (COUNTb) operated by positive logic pulses and receiving the data edge detection signals from the sub-data edge detection circuit as reset input signals for generating repetitive pulses synchronized with output from said second mentioned delay flip-flop (FF2b);
    an adder (G) for performing logical addition of output of said synchronous pulse generation circuit (COUNTa) and said sub-synchronous pulse generation circuit (COUNTb);
    an adder (E') for performing logical addition of output of said delay flip-flops (FF2a, FF2b);
    a waveform shaping circuit (D) composed of a delay flip-flop (FF4a) operated by positive logic pulses for eliminating hazardous or extraneous signals
    and an output timing circuit (E) composed of a delay flip-flop (FF3a) operated by positive logic clock pulses for adjusting output timing of output data and synchronous clock pulses output from said waveform shaping circuit.

* * * * *